United States Patent
Chang et al.

(10) Patent No.: US 12,414,304 B2
(45) Date of Patent: Sep. 9, 2025

(54) 3D MONOLITHIC STACKING MEMORY STRUCTURE WITH OXIDE-SEMICONDUCTOR FIELD EFFECT TRANSISTOR AND FERROELECTRIC METAL-INSULATOR-METAL STORAGE CAPACITOR

(71) Applicant: Powerchip Semiconductor Manufacturing Corporation, Hsinchu (TW)

(72) Inventors: Shou-Zen Chang, Hsinchu (TW); Ming-Han Liao, Hsinchu (TW); Min-Cheng Chen, Hsinchu County (TW); Hiroshi Yoshida, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 490 days.

(21) Appl. No.: 17/692,135

(22) Filed: Mar. 10, 2022

(65) Prior Publication Data

US 2023/0171966 A1 Jun. 1, 2023

(30) Foreign Application Priority Data

Nov. 29, 2021 (TW) ................................ 110144430

(51) Int. Cl.
*H10B 51/20* (2023.01)
*G11C 11/22* (2006.01)
(Continued)

(52) U.S. Cl.
CPC ............ *H10B 51/20* (2023.02); *G11C 11/221* (2013.01); *G11C 11/2273* (2013.01);
(Continued)

(58) Field of Classification Search
CPC ... H10B 51/20; G11C 11/221; G11C 11/2273; G11C 11/2275
See application file for complete search history.

(56) References Cited

U.S. PATENT DOCUMENTS

| 2015/0003165 A1 | 1/2015 | Yamauchi |
| 2016/0054362 A1 | 2/2016 | Tsubuku |

(Continued)

FOREIGN PATENT DOCUMENTS

| CN | 104205228 A | 12/2014 |
| TW | 201201212 A1 | 1/2012 |

*Primary Examiner* — Lex H Malsawma
*Assistant Examiner* — Bruce R. Smith
(74) *Attorney, Agent, or Firm* — Winston Hsu

(57) ABSTRACT

A 3D monolithic stacking memory structure is provided in the present invention, including a semiconductor substrate, a field effect transistor (FET) on the semiconductor substrate, a plurality of back-end metal layers on the FET and the semiconductor substrate, an oxide-semiconductor FET (OSFET) in the back-end metal layers, wherein a drain of the OSFET is connected with a gate of the FET, and a FEMIM storage capacitor formed on the back-end metal layers, wherein a bottom electrode of the FEMIM storage capacitor is connected with the drain of the OSFET and the gate of the FET, and the FET, the OSFET and the FEMIM storage capacitor are stacked in order from bottom to top on the semiconductor substrate.

9 Claims, 3 Drawing Sheets

(51) Int. Cl.
  *H01L 23/528* (2006.01)
  *H10D 30/67* (2025.01)

(52) U.S. Cl.
  CPC ...... *G11C 11/2275* (2013.01); *H01L 23/5283* (2013.01); *H10D 30/6755* (2025.01)

(56) References Cited

U.S. PATENT DOCUMENTS

| | | | |
|---|---|---|---|
| 2017/0186779 A1 | 6/2017 | Ito | |
| 2018/0248010 A1* | 8/2018 | Endo | H01L 27/1288 |
| 2019/0318775 A1* | 10/2019 | Rakshit | G11C 11/221 |
| 2020/0342932 A1* | 10/2020 | Bennett | G11C 11/4096 |

* cited by examiner

3D MONOLITHIC STACKING MEMORY STRUCTURE WITH OXIDE-SEMICONDUCTOR FIELD EFFECT TRANSISTOR AND FERROELECTRIC METAL-INSULATOR-METAL STORAGE CAPACITOR

BACKGROUND OF THE INVENTION

1. Field of the Invention

The present invention relates to a memory structure, and more specifically, to a memory structure with 3D monolithic stack of oxide-semiconductor field effect transistor (OSFET) and ferroelectric metal-insulator-metal (FEMIM) storage capacitor.

2. Description of the Prior Art

With the emergence of artificial intelligence (AI) in recent years, the accomplishing of various novel technologies are driven through AI, machine learning and deep learning in many technology fields. Since AI system and AI algorithm provide machines (ex. computer) with models capable of data processing, reasoning and deep learning, these AI systems and models are usually trained in high intensity to execute specific tasks, such as tasks like neuro-linguistic processing, image recognition, planning and making a decision.

In the light of incoming tide of AI and demand for increasing computer speed, conventional computer adopted worldwide based on Von Neumann architecture (i.e. the architecture separating memory and CPU and transmitting data therebetween through data bus) has reached its limit and obstacle in AI computing with computation load frequently over hundreds of million. This kind of limit problem would get worse if there is larger gap between the computing speed of CPU and transmission rate of memory, especially in the development of cognitive computing that requires effective process of a huge mass of data. This would be a great challenge to conventional Von Neumann architecture, which can't fulfill increasing data-intensive applications and face a turning point in the change of memory technology. It happens that the technology of in-memory computing is quite suitable for AI hardware acceleration. The two technologies may complement each other and accelerate their development. In-memory computing technology therefore emerges as the times as a promising architecture for those of skilled in the art to pursue currently, and the market of in-memory computing is also expanded.

In another aspect, real-time and continuous analog data may be analyzed directly at edge devices when it is used for AI computation. Since it is not necessary to be converted to digital data and transferred to memory, a lot of power consumption may be saved in the data transmission between memory and CPU. Therefore, necessary transistor number may be greatly reduced in the architecture of analog AI chip. For example, to execute 8-bit parallel computing based on digital data, it requires about three thousand transistors to do a multiplication and about three hundred transistors to do an addition. In comparison thereto, to execute 8-bit parallel computing based on analog data, it requires only about thirty transistors to do a multiplication or an addition, and the power consumption is merely 1% of the one of original digital computation.

Nevertheless, as semiconductor devices are miniaturized to their physical limits, it is still an objective for those of skilled in the art strive to research and develop, to increase device integration, reduce power consumption and integrate multifunctional circuits through the use of monolithic 3D-IC architecture, in order to fulfill the requirement of AI application.

SUMMARY OF THE INVENTION

In light of the aforementioned current situation and requirement of conventional skills, the present invention hereby provides a novel 2T1C (two transistors and one capacitor) 3D monolithic stacking memory structure, with the feature of using oxide-semiconductor field effect transistor (OSFET) as a write-in transistor to well control the multilevel analog states of analog memory. Furthermore, ferroelectric metal-insulator-metal (FEMIM) storage capacitor is used in the invention and set on top of back-end-of-line (BEOL) metal layers in CMOS process, so that this approach may facilitate 3D architecture design for the FEMIM storage capacitor to obtain larger storage capacitance and achieve 3D monolithic stacking architecture together with the OSFET and read transistors on the substrate, in order to significantly improve device density and storage density.

The purpose of present invention is to provide a 3D monolithic stacking memory structure, including a semiconductor substrate, a field effect transistor (FET) on the semiconductor substrate, multiple back-end-of-line (BEOL) metal layers on the field effect transistor and the semiconductor substrate, an oxide-semiconductor field effect transistor (OSFET) in the multiple BEOL metal layers, wherein a drain of the OSFET connects with a gate of the FET, and a ferroelectric metal-insulator-metal (FEMIM) storage capacitor formed on top of the multiple BEOL metal layers, and the FEMIM storage capacitor includes a capacitive dielectric layer set between a top electrode and a bottom electrode, and the top electrode is a top metal layer of the multiple BEOL metal layers, wherein the bottom electrode connects with the drain of OSFET and the gate of FET, and the FET, the OSFET and the FEMIM storage capacitor are set sequentially from bottom to top on the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
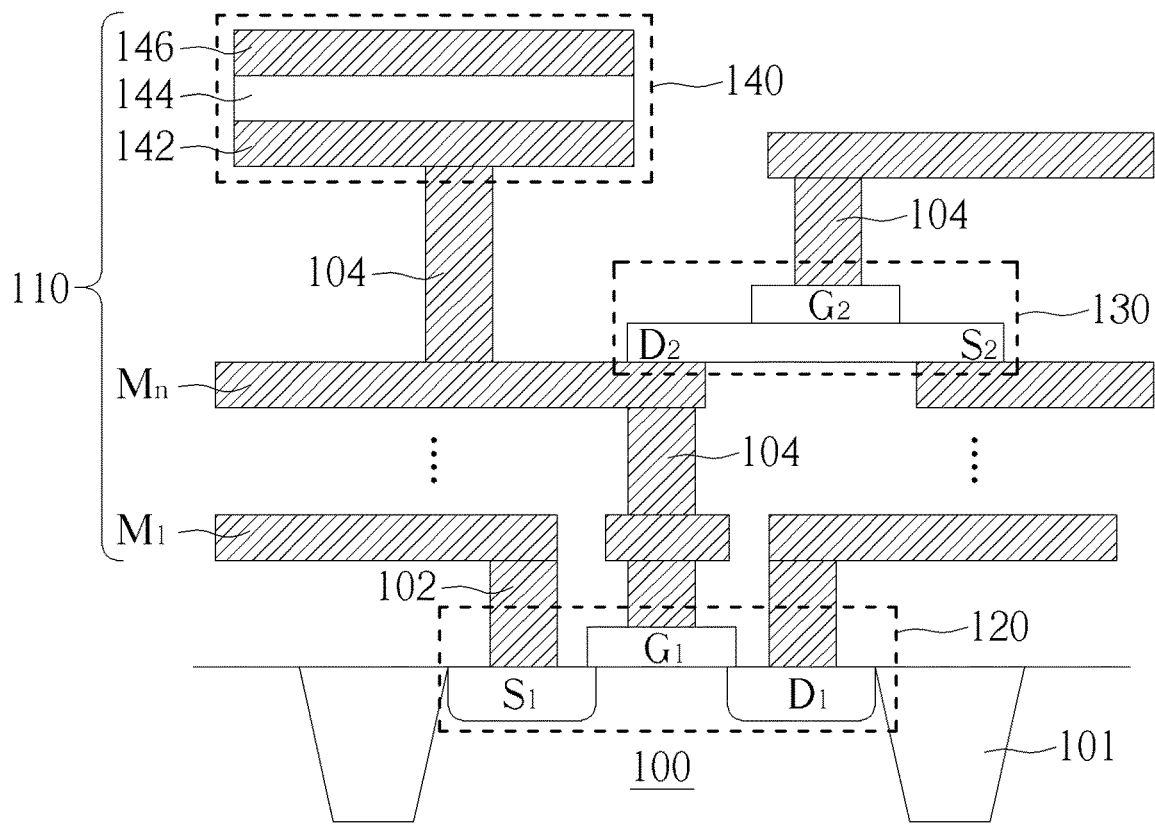
FIG. 1 is a schematic cross-section of a 3D monolithic stacking memory structure in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature's relationship to another element (s) or feature (s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or heterogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The purpose of present invention is to provide a 3D monolithic stacking memory structure, which includes a field effect transistor (ex. metal-oxide-semiconductor field effect transistor, MOSFET) and an oxide-semiconductor field effect transistor (OSFET) to function respectively as a read-out transistor and a write-in transistor for the memory structure, and includes a high-capacitance ferroelectric metal-insulator-metal (FEMIM) storage capacitor to function as a storage node for the memory structure. The three components constitute a 2T1C unit cell and integrated on the same substrate and in the same semiconductor process in a 3D monolithic stacking architecture.

Please refer first to FIG. 1, which is a schematic cross-section of a 3D monolithic stacking memory structure in accordance with one embodiment of the present invention. The structural composition of the memory structure of the present invention in the direction vertical to the substrate may be understood through this cross-section. As shown in FIG. 1, the memory structure of present invention includes a substrate 100 functioning as a structural base for entire memory structure. The substrate 100 may be any component with carrier function, for example a semiconductor substrate, including silicon-based substrate, silicon-on-insulator (SOI) substrate, sapphire substrate, but not limited thereto. Silicon oxide based shallow trench isolations (STI) 101 are formed in the substrate 100 to define and isolate individual active areas. Only one active area and the components thereon are shown in the figure as an example. A field effect transistor (FET) 120 is formed on the active area of substrate 100. In the embodiment of present invention, the FET 120 may be a metal-oxide-semiconductor field effect transistor (MOSFET) with components like gate $G_1$, source $S_1$ and drain $D_1$, wherein source $S_1$ and drain $D_1$ are doped regions in the substrate 100 and are electrically connected to a first metal layer $M_1$ above through contacts 102. Gate $G_1$ is set between source $S_1$ and drain $D_1$ with materials like polysilicon or metal to control the channel switch ON/OFF between source $S_1$ and drain $D_1$, and it is also electrically connected to the first metal layer $M_1$ above through a contact 102. In the embodiment of present invention, FET 120 functions as a read transistor.

Refer still to FIG. 1. Back-end-of-line (BEOL) interconnect 110 in CMOS process are formed above the substrate 100 and the FET 120, which include multiple BEOL metal layers $M_1$~$M_n$, inter-metal dielectrics (IMD, not shown) and vias 104 in the IMDs. These BEOL metal layers $M_1 \sim M_n$ are electrically connected with each other through vias 104. In the embodiment of present invention, an oxide-semiconductor field effect transistor (OSFET) 130 is further formed in the BEOL interconnect 110 to function as a write-in transistor at a position preferably overlapping the FET 120 below in a direction vertical to the substrate. Similarly, the OSFET 130 is also provided with components like gate $G_2$, source $S_2$ and drain $D_2$, wherein gate $G_2$ may be a word line by itself, or alternatively, it may be connected to a word line through a via 104. Source $S_2$ and drain $D_2$ are set respectively at two sides of gate $G_2$ and are connected to the BEOL metal layer $M_n$ below, or alternatively, they may be parts of the BEOL metal layer $M_n$ or may be connected to other BEOL metal layers, such as a bit line, through vias 104. The material of gate $G_2$ of OSFET 130 may be a conductive layer, such as copper (Cu), aluminum (Al), molybdenum (Mo), chromium (Cr), titanium (Ti) or tantalum (Ta), or alternatively, the material may be the nitride of aforementioned metal elements, such as titanium nitride, molybdenum nitride, tungsten nitride. Still alternatively, the material may be conductive metal oxide, such as indium oxide ($In_2O_3$), tin oxide ($SnO_2$), zinc oxide (ZnO), $In_2O_3$—$SnO_2$ or $In_2$—$O_3$—ZnO. In the embodiment of present invention, the OSFET 130 is provided with a channel layer (not shown) made of oxide semiconductor material, such as gallium oxide ($GaO_x$), gallium zinc oxide ($Ga_2Zn_xO_y$) or indium gallium zinc oxide (IGZO), especially c-axis aligned crystalline IGZO (CAAC-IGZO) with high carrier mobility and low leakage current. A gate dielectric layer (not shown) made of metal oxide material, such as hafnium dioxide ($HfO_2$), aluminium oxide ($Al_2O_3$) with high k and low leakage current is also provided between the gate $G_2$ and the channel layer.

In the embodiment of present invention, the OSFET 130 is used as a write-in transistor, especially in the design that the channel layer is made of IGZO material, with excellent linearity and ultra low leakage current (<1 nA/cell) suitable as a write-in transistor to control the multilevel storage states of analog memory, which will be further explained in following embodiments.

Refer still to FIG. 1. In the embodiment of present invention, a ferroelectric metal-insulator-metal (FEMIM) storage capacitor 140 is set on top of the BEOL interconnect 110 at a position preferably partially overlapping the OSFET 130 and the FET 120 below in the direction vertical to the substrate. As shown in FIG. 1, FEMIM storage capacitor 140 includes a top electrode 146, a bottom electrode 142 and a capacitive dielectric layer 144 sandwiched in between the top electrode 146 and the bottom electrode 142. In the embodiment of present invention, bottom electrode 142 may be electrically connected to the BEOL metal layer $M_n$ below through a via 104, while the top electrode 146 may be a part of the top metal layer of the BEOL interconnect 110. The material of top electrode 146 and bottom electrode 142 may be metal, such as copper (Cu), aluminum (Al), molybdenum (Mo), chromium (Cr), titanium (Ti) or tantalum (Ta), or alternatively, the material may be the nitride of aforementioned metal elements, such as titanium nitride, molybdenum nitride, tungsten nitride. The material of capacitive dielectric layer 144 may be a single layer or multilayer structure made of ferroelectric material, such as lead zirconate titanate (PZT), hafnium zirconium oxide (HZO), barium titanate ($BaTiO_3$), lead titanate ($PbTiO_3$) or hafnium oxide doped with element like nitrogen (N), silicon (Si), aluminum (Al), yttrium (Y) or strontium (Sr), wherein HZO is preferred since it may provide higher capacitance and multilevel storage states required by the analog memory.

Please note that in the preferred embodiment of present invention, the FET 120 is set on the surface of substrate 100 in CMOS front-end-of-line (FEOL) process, the OSFET 130 is set in the BEOL interconnect 110 in CMOS BEOL process, while the FEMIM storage capacitor 140 is set on top of the BEOL interconnect 110, and these three components preferably overlap each other. The advantage of this architecture and order is that it is more compatible to CMOS process and may provide better control for overall thermal budget of the process, and to achieve the results of increasing device integration and storage density, reducing power consumption, integrating multifunctional circuits and lowering manufacturing cost required by the 3D monolithic stacking structure.

Figure 2:
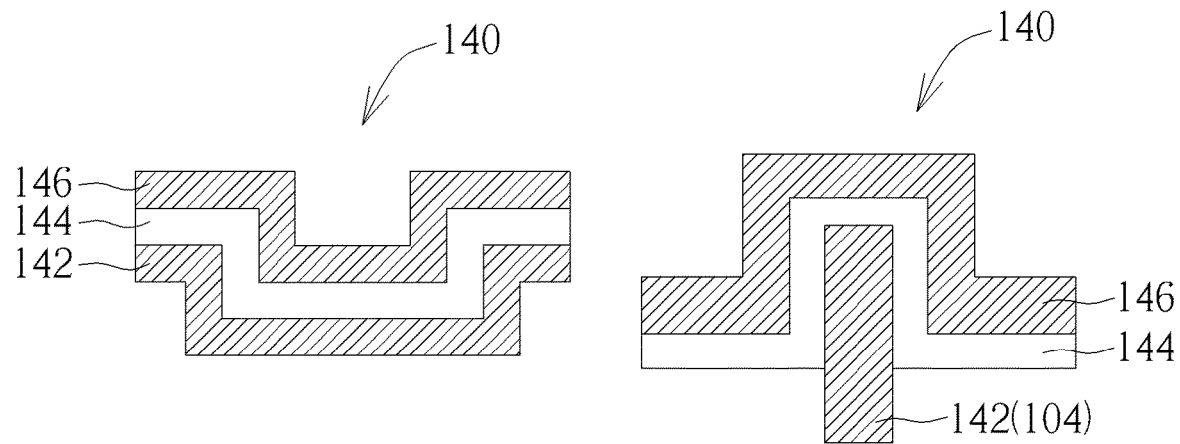
FIG. 2 is a schematic cross-section of a ferroelectric metal-insulator-metal (FEMIM) storage capacitor in different modes in accordance with one embodiment of the present invention.

In another aspect, in comparison to the design of setting storage nodes on substrate surface or in BEOL interconnect in prior art, setting entire FEMIM storage capacitor 140 in free space on top of the BEOL interconnect 110 may provide the FEMIM storage capacitor 140 of present invention more degree of freedom in design. For example, as shown in FIG. 2, the FEMIM storage capacitor 140 in this architecture may be easily and designedly provided with multiple U-shaped or inverted U-shaped cross-sectional profile, so as to increase capacitor area per unit layout area and improve capacitance. In the embodiment of inverted U-shaped FEMIM storage capacitor, underlying via 104 may be used directly as a bottom electrode 142 of the FEMIM storage capacitor 140, with the top electrode 146 and the capacitive dielectric layer 144 encapsulating on parts of sidewalls of the bottom electrode 142. The capacitor area may be easily increased in this way.

Figure 3:
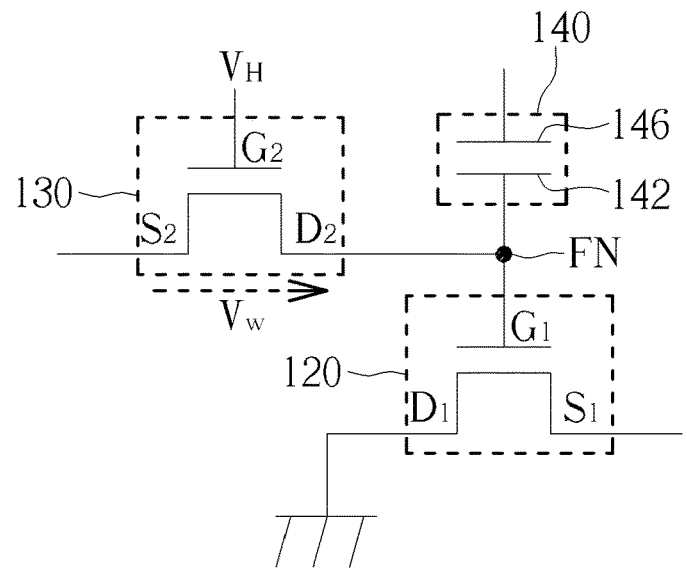
FIG. 3 is a schematic circuit diagram of the 3D monolithic stacking memory structure in write operation in accordance with one embodiment of the present invention.

Please now refer to FIG. 3, which is a schematic circuit diagram of the 3D monolithic stacking memory structure in write operation in accordance with one embodiment of the present invention. As shown in FIG. 3, the 3D monolithic stacking memory structure is in a 2T1C architecture composed collectively of a FET 120, an OSFET 130 and FEMIM storage capacitor 140, wherein the drain $D_2$ of OSFET 130, the gate $G_1$ of FET 120 and the bottom electrode 142 of FEMIM storage capacitor 140 are connected to a common floating node FN. In the write operation, the channel of transistor may be opened by applying a high level voltage $V_H$ to the gate $G_2$ of OSFET (i.e. write-in transistor) 130, and a write-in voltage $V_W$ is applied from the source $S_2$ of OSFET 130 to the floating node FN through the opened channel. No voltage is applied to the top electrode 146 of FEMIM storage capacitor 140 and the source $S_1$ of FET 120 at this time, and the write-in voltage $V_W$ at floating node FN makes the FEMIM storage capacitor 140 in one of analog states to complete the write-in operation. In the embodiment of present invention, since the OSFET 130 has ultra low leakage off-current (<1 A/cell), so it may properly maintain the voltage at the floating node FN make it suitable for distinguishing multilevel storage states through subtle voltage differences.

Figure 4:
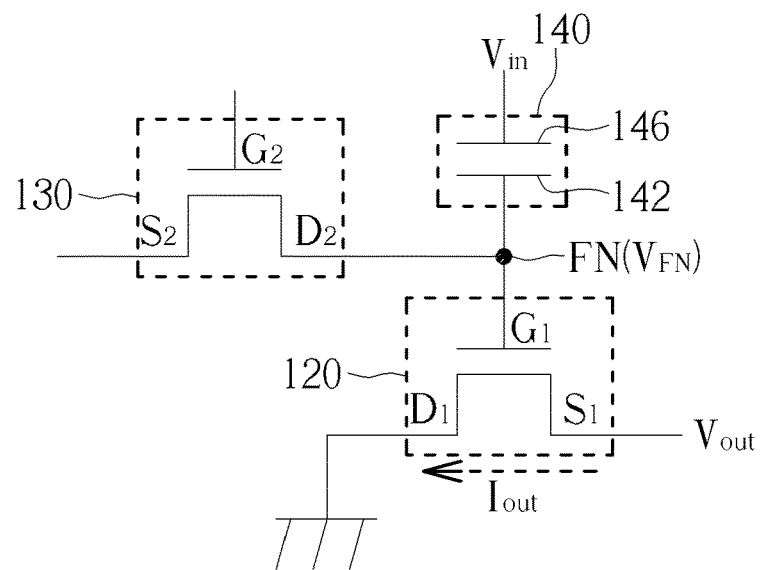
FIG. 4 is a schematic circuit diagram of the 3D monolithic stacking memory structure in read operation in accordance with one embodiment of the present invention.

Please now refer to FIG. 4, which is a schematic circuit diagram of the 3D monolithic stacking memory structure in read operation in accordance with one embodiment of the present invention. In read operation, the gate $G_2$ of OSFET 130 will not be applied with high level voltage $V_H$, thus the OSFET 130 is closed, while the top electrode 146 of FEMIM storage capacitor 140 is applied with an input voltage $V_{in}$, so that the floating voltage $V_{FN}$ at floating node FN becomes the sum (ex. 0.3V) of write-in voltage $V_W$ (ex 0.2V) originally there and input voltage $V_{in}$ (ex. 0.1V). At the same time, an output voltage $V_{out}$ is applied to the source $S_1$ of FET 120 to generate an output current $I_{out}$ flowing to the ground through the opened channel and drain $D_2$. In this read operation, the value of output current $I_{out}$ is influenced by the open degree of the gate $G_1$ of FET 120, i.e. influenced by the value of floating voltage $V_{FN}$ at floating node FN. In this way, in the condition that the input voltage $V_{in}$ remains unchanged, the original write-in voltage $V_W$ may determine and control the value of output current $I_{out}$, so that read the value of output current $I_{out}$ may learn the analog storage state of floating node FN to complete the read operation.

Figure 5:
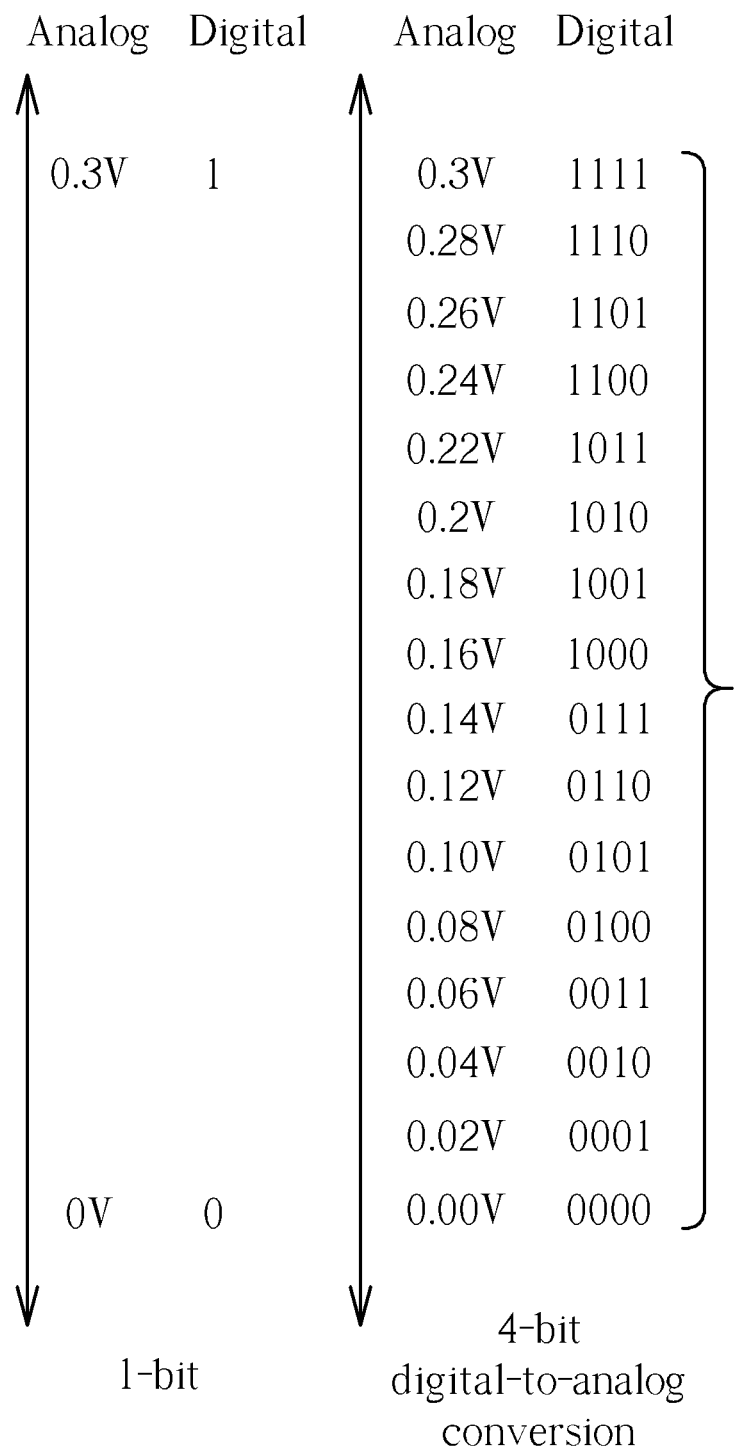
FIG. 5 is a cross reference table for the conversion of 1-bit and 4-bit digital data and analog signal conversion in accordance with one embodiment of the present invention.

Please now refer to FIG. 5, which is a cross reference table for the conversion of 1-bit and 4-bit digital data and analog signal conversion in accordance with one embodiment of the present invention. As shown in FIG. 5, conventional 1-bit digital signal ("0" low state or "1" high state) may just correspond to two different voltages (0V and 0.3V) of analog signal, and 4-bit digital signal (digital data with 4 characters made of "0" and/or "1", 16 kinds in total) may correspond to different voltages (0.00V to 0.3V at a voltage interval 0.02V) of the analog signal. In the embodiment of present invention, since the OSFET 130 has good linearity and ultra low leakage current, it may perfectly control the floating voltage $V_{FN}$ at floating node FN at a value corresponding to the storage state to be written, so that it is quite suitable to be applied in multilevel AI in-memory computation. For example, convert the digital signal to be inputted in advance into corresponding analog signal through digital-to-analog converter (DAC), plus the write-in voltage $V_W$ applied through the OSFET 130 to weight and control, so that the computation may be directly conducted in the AI memory. The analog results after computing is converted back to corresponding digital signal through analog-to-digital converter (ADC) for outputting, so as to complete the in-memory multilevel analog storage and computation.

In conclusion to the aforementioned embodiments, it can be understood that the present invention provide an approach using OSFET having low leakage current as a write-in transistor for controlling the multilevel storage states in 2T1C analog memory architecture, and setting the FEMIM storage capacitor with high capacitance on BEOL metal layers to increase capacitor area, and 3D monolithic stacking design is adopted in the invention to overlap the write-in transistor, read-out transistor and FEMIM storage capacitor in the direction vertical to the substrate, in order to significantly increase device density and storage density, which is the key feature and advantage of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A 3D monolithic stacking memory structure, comprising:
   a semiconductor substrate;
   a field effect transistor (FET) on said semiconductor substrate;
   a back-end-of-line (BEOL) interconnect on said field effect transistor and said semiconductor substrate, and said BEOL interconnect comprises multiple BEOL metal layers, inter-metal dielectrics and vias;
   an oxide-semiconductor field effect transistor (OSFET) in said BEOL interconnect, wherein a drain of said OSFET connects with a gate of said FET, and said drain and a source of said OSFET are parts of said BEOL metal layers; and
   a ferroelectric metal-insulator-metal (FEMIM) storage capacitor formed on top of said BEOL interconnect, wherein said FEMIM storage capacitor with high capacitance provides multilevel storage states in read operation of said 3D monolithic stacking memory structure, and said FEMIM storage capacitor comprises a capacitive dielectric layer set between a top electrode and a bottom electrode, and said bottom electrode is one of said multiple vias extending through said inter-metal dielectrics of said BEOL interconnect, and said capacitive dielectric layer is in a shape of inverted-U directly encapsulating on parts of a sidewall of said bottom electrode, and said top electrode formed on said capacitive dielectric layer is a top metal layer of said multiple BEOL metal layers, and said bottom electrode connects with said drain of said OSFET and said gate of said FET, wherein said FET, said OSFET and said FEMIM storage capacitor are set sequentially from bottom to top on said semiconductor substrate.

2. The 3D monolithic stacking memory structure of claim 1, wherein a source of said OSFET connects with a write-in voltage.

3. The 3D monolithic stacking memory structure of claim 2, wherein said top electrode of said FEMIM storage capacitor connects with an input voltage.

4. The 3D monolithic stacking memory structure of claim 3, wherein a common connection point of said drain of said OSFET, said gate of said FET and said bottom electrode of said FEMIM storage capacitor is a floating node, and said floating node has a floating voltage equal to said write-in voltage plus said input voltage.

5. The 3D monolithic stacking memory structure of claim 4, wherein said drain of said FET is grounded and a source of said FET is connected with an output voltage, and an output current flows from said source of said FET to said drain of said FET.

6. The 3D monolithic stacking memory structure of claim 5, wherein a value of said output current read by said field effect transistor is corresponding to said floating voltage.

7. The 3D monolithic stacking memory structure of claim 1, wherein said FET, said OSFET and said FEMIM storage capacitor overlap each other in a direction vertical to a surface of said semiconductor substrate.

8. The 3D monolithic stacking memory structure of claim 1, wherein said OSFET is an indium gallium zinc oxide (IGZO) thin-film transistor (TFT).

9. The 3D monolithic stacking memory structure of claim 1, wherein a material of said capacitive dielectric layer is hafnium zirconium oxide.

* * * * *